United States Patent [19]

Cordoba et al.

[11] Patent Number: 5,347,172
[45] Date of Patent: Sep. 13, 1994

[54] OSCILLATORLESS SUBSTRATE BIAS GENERATOR

[75] Inventors: Michael V. Cordoba; Kim C. Hardee, both of Colorado Springs, Colo.

[73] Assignees: United Memories, Inc., Colorado Springs, Colo.; Nippon Steel Semiconductor Corporation, Chiba, Japan

[21] Appl. No.: 964,912

[22] Filed: Oct. 22, 1992

[51] Int. Cl.⁵ ............................................. H03K 3/354
[52] U.S. Cl. ................... 307/296.2; 307/304; 307/296.8
[58] Field of Search ................... 307/304, 296.2, 296.6, 307/296.8, 272.3

[56] References Cited

U.S. PATENT DOCUMENTS

| | | | |
|---|---|---|---|
| 4,142,114 | 2/1979 | Green | 307/296.2 |
| 4,356,412 | 10/1982 | Moench et al. | 307/304 |
| 4,401,897 | 8/1983 | Martino, Jr. et al. | 307/296.2 |
| 4,553,047 | 11/1985 | Dillinger et al. | 307/304 |
| 4,581,546 | 4/1986 | Allan | 307/297 |
| 4,585,954 | 4/1986 | Hashimoto et al. | 307/296.2 |
| 4,739,191 | 4/1988 | Puar | 307/296.2 |
| 4,883,976 | 11/1989 | Deane | 307/296.5 |
| 4,935,644 | 1/1990 | Tsujimoto | 307/304 |
| 5,126,590 | 1/1992 | Chern | 307/296.2 |
| 5,153,855 | 10/1992 | Konishi | 365/229 |
| 5,191,235 | 3/1993 | Hara | 307/296.2 |
| 5,220,534 | 6/1993 | Redwine et al. | 365/226 |

FOREIGN PATENT DOCUMENTS 0030244 6/1981 European Pat. Off. .
0498107 8/1992 European Pat. Off. .
2149251 6/1985 United Kingdom .

OTHER PUBLICATIONS

R. C. Foss, et al., *Application of High Votlage Pumped Supply for Low-Power DRAM*, Symposium on VLSI Circuits, Digest of Technical Papers (1992).

Martino, Jr., et al., *An On-Chip Back Bias Generator For MOS Dynamic Memory*, IEEE Journal of Solid-State Circuits, (Oct. 1980).

Gillingham, et al., *High-Reliability Circuit Design for Megabit DRAM*, IEEE Journal of Solid-State Circuits, vol. 26, No. 8, Aug. 1991.

*Primary Examiner*—Timothy P. Callahan
*Assistant Examiner*—Dinh Le
*Attorney, Agent, or Firm*—Edward D. Manzo

[57] ABSTRACT

A substrate bias generator avoids using a free-running oscillator and thereby saves power in the standby mode. A clock enable signal from a regulator sets a latch in a self-timed clock circuit. The latch setting initiates a first group of clock signals (that are used by a pump circuit for pumping), at the end of which the latch is reset but concomitantly an input circuit to the latch is disabled from recognizing a new pump signal. Resetting the latch causes the clock circuit to generate a second group of clock signals used in the charge pump to prepare fully for the next demand for pumping. At the end of the second group of clock signals, a full cycle of clocks has been completed in a self-timed manner, and the input circuit to the latch is reenabled to recognize a subsequent pump signal.

35 Claims, 7 Drawing Sheets

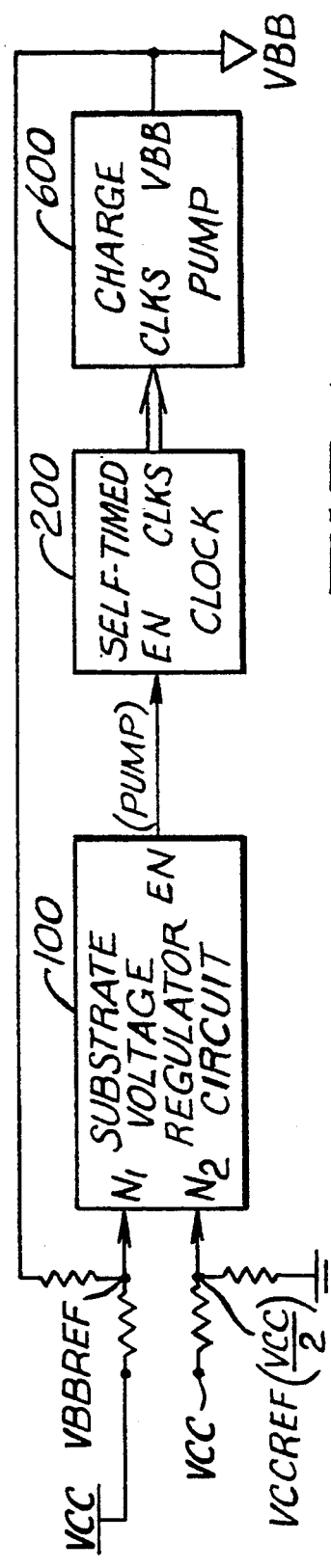
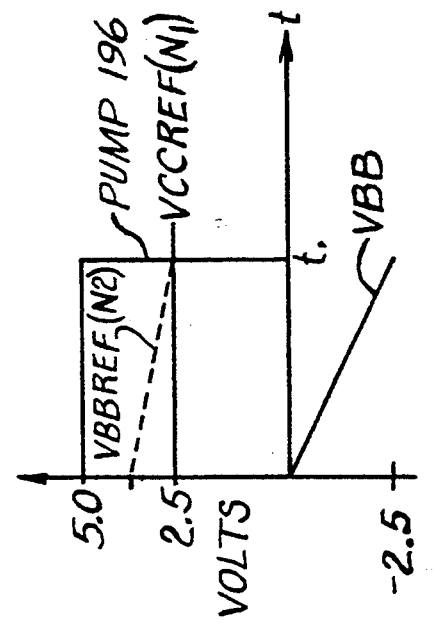
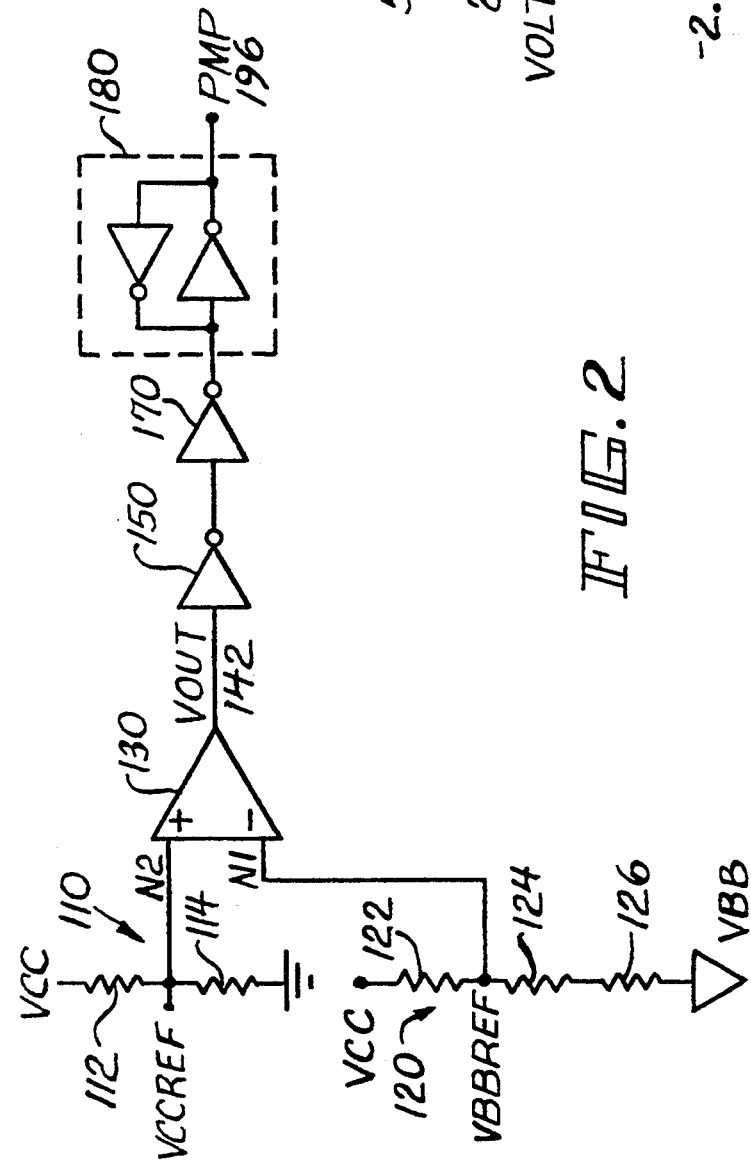
FIG. 1
FIG. 3
FIG. 2

OSCILLATORLESS SUBSTRATE BIAS GENERATOR

FIELD OF THE INVENTION

This invention relates to an integrated circuit substrate pump having no oscillator, and more particularly to an oscillatorless integrated circuit substrate pump exhibiting low current and low power consumption.

DESCRIPTION OF THE PRIOR ART

Circuits in the prior art having substrate pumps to pump charge to the substrate and lower the voltage at the substrate use an oscillator to clock the pump. Typically, the oscillator is free running. The pump is activated if the voltage at the substrate rises above a certain value. The free running oscillator may draw approximately 100 microamperes ($\mu A$) of current. The power loss through this constant running oscillator is not a concern if the circuit is not used in battery back up operations. However, with a new emphasis on portability, reducing current and power loss has become a major concern.

SUMMARY OF THE INVENTION

The substrate bias generation circuit of the present invention provides a voltage regulator having a self-timed circuit in place of an oscillator, therefore saving considerable power when in the standby mode. A DC regulator, which itself is designed to draw low current and consume low power, is the only circuit which is constantly running and consuming power. When the charge pump is not pumping, the current in the circuit can be less than a few microamperes. The DC regulator enables a self-timed clock circuit only when a substrate voltage $V_{BB}$ is too high. The self-timed clock circuit controls a charge pump which pumps substrate voltage $V_{BB}$ to a more negative value. This self-timed clock circuit drives the charge pump until $V_{BB}$ has reached a desired level and the DC regulator signals it to stop. The clock circuit is self-timed because it ignores a signal to pump until the charge pump is ready to pump.

A substrate bias generator according to the present invention does not rely on a free-running oscillator. A clock enable signal from a regulator preferably sets a latch in the self-timed clock circuit. Setting the latch initiates a first group of clock signals (that are used by a pump circuit for pumping), preferably at the end of which the latch is reset but concomitantly an input circuit to the latch is disabled from recognizing a new pump signal. Preferably the resetting of the latch causes the clock circuit to generate a second group of clock signals used in the charge pump to prepare fully for the next demand for pumping. Preferably at the end of the second group of clock signals, a full cycle of clock signals has been completed in a self-timed manner, and the input circuit to the latch is reenabled to recognize a subsequent pump signal.

It is an object of the invention to provide a substrate bias voltage generator which eliminates the need for a free running oscillator circuit.

It is a further object of the invention to provide a substrate bias voltage generator which limits current in the circuit and reduces power consumption, particularly when in the standby mode.

Finally, it is an object of the invention to provide a self-timed substrate bias generator to maintain the voltage level on the substrate of an integrated circuit.

BRIEF DESCRIPTION OF THE DRAWINGS

In describing the preferred embodiment, reference is made to accompanying drawings, wherein:

FIG. 1 is a block diagram of the substrate bias generator circuit according to a preferred embodiment of the present invention;

FIG. 2 is a schematic diagram of the substrate voltage regulator circuit of FIG. 1;

FIG. 3 is a timing diagram showing input and output signals to the substrate voltage regulator circuit of FIG. 2;

DESCRIPTION OF THE PREFERRED EMBODIMENTS

Figure 4:
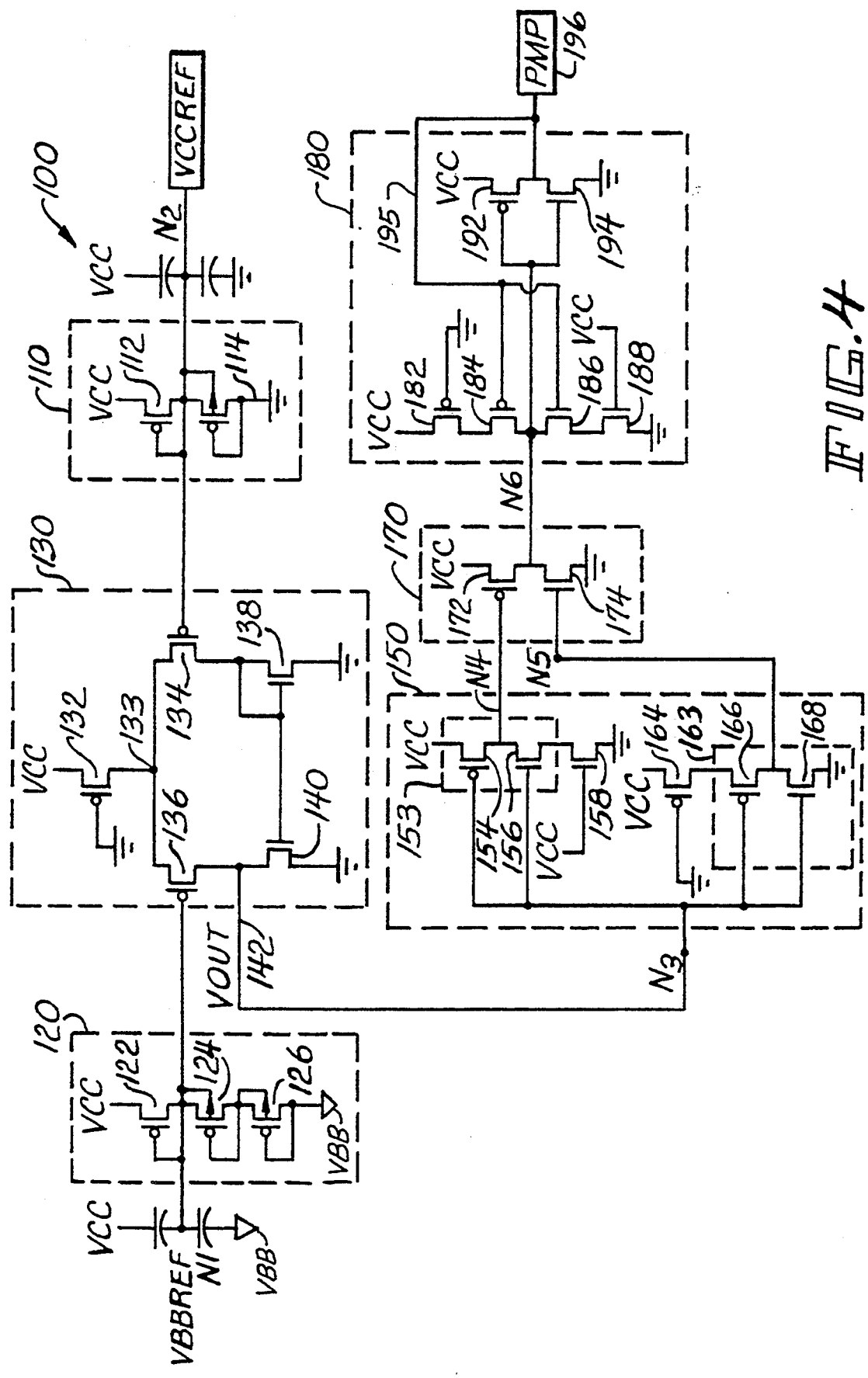
FIG. 4 is a detailed schematic of the substrate voltage regulator circuit of FIG. 2.

FIG. 1 is a block diagram that shows the general structure of the oscillatorless substrate bias generator circuit of the present invention. A signal $V_{BBREF}$ (which is proportional to the substrate voltage $V_{BB}$) is input to a voltage regulator 100. The $V_{BBREF}$ signal is compared to a reference voltage $V_{CCREF}$, preferably $V_{CC}/2$, to determine whether the substrate voltage $V_{BB}$ has risen above a certain predetermined level (for example, approximately minus two ($-2$) volts). If substrate voltage $V_{BB}$ has risen above that level, regulator circuit 100 enables a self-timed clock circuit 200. Clock circuit 200 generates clock signals which control a charge pump 600 which pumps electrons to $V_{BB}$ (or draws current from $V_{BB}$) to lower the potential at $V_{BB}$ to a desired level.

THE VOLTAGE REGULATOR CIRCUIT

A simple schematic diagram is shown in FIG. 2 to describe the operation of the substrate voltage regulator circuit 100 of FIG. 1. As mentioned earlier, the substrate voltage regulator circuit monitors the substrate voltage $V_{BB}$ to determine whether $V_{BB}$ has risen above a desired level. A resistor network 120 comprising resistors 122, 124 and 126 is used to generate a voltage $V_{BBREF}$ (which is proportional to the substrate voltage) at the negative input (node N1) of the differential amplifier 130. A second resistor network 110 comprising resistors 112 and 114 is used to generate a reference voltage $V_{CCREF}$ at the positive input (node N2) of the differential amplifier 130.

As will be shown in detail in the timing diagram in FIG. 3, if the substrate bias voltage becomes too positive, $V_{BBREF}$ will exceed $V_{CCREF}$ and the comparator will output a low $V_{out}$ signal 142. $V_{out}$ 142 is passed through a series of inverters (150, 170 and 180 which will be discussed in detail in reference to FIG. 4) to generate a pump signal 196. Therefore, when the $V_{BB}$ signal is insufficiently negative, the substrate voltage regulator circuit 100 will generate a high pump signal 196 to activate self-timed clock circuit 200 and charge pump 600. Otherwise, a low pump signal 196 disables self-timed clock circuit 200, and both the clock and the charge pump remain off.

FIG. 3 shows a timing diagram of the input and output signals of $V_{BB}$ regulator 100, and specifically shows when the pump signal 196 changes between high and low signals to enable or disable self-timed clock circuit 200 and charge pump 600. Although the timing diagram of FIG. 3 includes a 5 volt $V_{CC}$, a 3 volt $V_{CC}$ is also contemplated in the present invention. Because $V_{CC}$ is fixed, the positive input $V_{CCREF}$ to the differential amplifier is fixed at approximately at $V_{CC}/2$ or 2.5 volts. However, $V_{BBREF}$ is dependent on $V_{BB}$, and therefore may vary with the substrate voltage. When $V_{BB}$ is initially at 0 volts, $V_{BBREF}$ is at approximately 3.3 volts (assuming that the resistance value of resistors 122, 124 and 126 are the same). Therefore, because $V_{BBREF}$ is greater than $V_{CCREF}$, the output of differential amplifier 130 will be low, and pump signal 196 will be high, activating the charge pump. As $V_{BB}$ is gradually decreased by pumping charge (electrons) to the substrate, $V_{BBREF}$ will gradually drop. At a time t1, $V_{BBREF}$ will drop below $V_{CCREF}$. Therefore, the output of differential amplifier 130 will now be high and pump signal 196 will be low, thereby turning off the clock circuit which clocks the charge pump. When $V_{BBREF}$ later rises above $V_{CCREF}$, the pump will again be turned on to lower the voltage of the substrate.

Having shown the general operation of the substrate voltage regulator circuit 100, additional features of the substrate voltage regulator circuit which reduce current loss and power consumption are shown in the detailed schematic diagram of FIG. 4. The preferred dimensions of the transistors in FIG. 4 (and the remaining figures) can be found in Appendix A. Also, the devices shown in the schematic diagrams are those well known in the art (e.g., transistor 124 of FIG. 4 is a P channel enhancement type transistor with its substrate tied to its source). Also, all transistors are preferably enhancement type transistors, although depletion type transistors could be used.

In order to reduce power consumption in the voltage bias generator circuit, the voltage regulator circuit 100 of FIG. 4 is designed to operate generally on low current and limit current loss in the circuit. In the preferred voltage regulator circuit, the resistor networks 110 and 120 include transistors configured as resistors (i.e. transistors having the gate tied to the source or drain). Because the current through the transistors is a function of the channel width/length ratio, the channel lengths of these enhancement resistors are generally large to limit current through the transistor networks.

The differential amplifier circuit 130 preferably includes transistors 132–140 configured to compare $V_{CCREF}$ with $V_{BBREF}$ and to provide an output ($V_{out}$) signal 142. The operation of differential amplifier circuit 130 is well known in the art. The preferred dimensions of the transistors 132–140 (shown in Appendix A) of the differential amplifier circuit 130 are specifically chosen to keep current in the circuit low, and therefore minimize power consumption. Specifically, the width/length ratio of the transistors of the differential amplifier circuit 130 is preferably kept small by selecting long channel lengths to limit the current flow. Although the specific design of differential amplifier circuit 130 is shown, other circuits which compare two signals to provide an output and limit current flow could be used within the scope of the present invention.

Although the long channel length of the transistors of the differential amplifier circuit limits the current flow, the circuit will generally react slowly and will output a slow changing signal 142 (i.e. a signal which does not have a sharp transition between low and high states). A slow changing signal can often lead to current loss in a circuit, particularly when applied to a two transistor inverter. Specifically, both transistors of the inverter will be on for a certain period of time, leading to "through current" or "crow bar current" through the series of transistors. Therefore, there is often current loss from $V_{CC}$ to ground by way of the two transistors during the transition.

To compensate for the slow changing signal 142, inverters 150 and 170 and latch 180 are specifically designed to reduce the through current in the inverters and to output a pump signal 196 having a sharp transition. The switching time of transistors is generally dependent on the channel width/length ratio. Therefore, the channel widths and lengths can be chosen to establish when the transistors of the inverter will switch. Because the widths of the transistors in circuit 150 are the same, the switching time will be a function of their channel lengths. The channel lengths of the transistors of 154, 156, 164 and 166 of circuit 150 are chosen so that the voltages at nodes N4 and N5 (and therefore transistors 172 and 174 of circuit 170) switch at an appropriate time.

Specifically, when $V_{out}$ signal 142 transitions from a high signal to a low signal to change the voltage at node N6 from high to low, it is beneficial to turn off transistor 172 before turning on transistor 174 to limit through current from $V_{CC}$ to ground in inverter 170. To accomplish the switching of the transistors of inverter 170 in this order, the length of transistor 166 is generally longer than that of transistor 154 to ensure that transistor 174 turns on after transistor 172 turns off.

In contrast, when $V_{out}$ transitions from a low signal to a high signal, it is beneficial to turn off transistor 174 before turning on transistor 172 to limit through current from $V_{CC}$ to ground. The length of transistor 156 is generally longer than that of transistor 168 to ensure that transistor 172 turns on after transistor 174 turns off. Therefore, the selection of channel lengths of the transistors of inverter circuit 150 eliminate any path from $V_{CC}$ to ground in inverter 170 during either transition.

To further limit through current in the voltage regulator circuit, transistors 158 and 164 are added to inverter 150 to reduce any through current in inverters 153 and 163. Because of the current-limiting transistors 158 and 164 have long channel lengths, nodes N4 and N5 will not be pulled rapidly to ground and $V_{CC}$, respectfully. Therefore, the path from $V_{CC}$ to ground will exist while driving transistors 172 and 174, but the current will be reduced in the series of transistors 154–158 and 164–168 by the long channel lengths of transistors 158 and 164.

Also, transistors 158 and 164 are selectively positioned to ensure that the timing of the switching of the transistors as described above is not affected. When node N3 is transitioning from high to low, it is preferable that the inverter 153 drive node N4 high very quickly by turning on transistor 154 to shut off transistor 172. Therefore, current-limiting transistor 158 is added only to the n-channel side of the inverter 153 to limit the effect of transistor 158 on transistor 154. While current-limiting transistor 158 does affect the timing of driving node N4 low when node N3 transitions from low to high, the capacitive coupling of transistor 158 to node N4 is large enough to pull node N4 low enough to turn on transistor 172 at an appropriate time.

Similarly, when node N3 transitions from low to high, it is preferred that inverter 163 drive node N5 low very quickly by turning on transistor 168 to shut off transistor 174. Hence, the current-limiting transistor 164 is added only to the p-channel side of inverter 163 to limit the effect of transistor 164 on transistor 168. While current-limiting transistor 164 does affect the timing of driving node N5 high when node N3 transitions from high to low, the capacitive coupling of transistor 164 to node N5 is large enough to pull node N5 high enough to turn on transistor 174 at an appropriate time.

Finally, latch 180 is also included in the voltage regulator circuit 100 to maintain the output of the pump signal 196 during the period when neither transistor 172 nor transistor 174 of inverter 170 is driven (as discussed above to prevent through current). Pump signal 196 is fed back via line 195 to transistor network 182–188 to maintain the original voltage at node N6 until the state of node N6 changes when inverter 170 drives node N6.

In order to reduce the power consumption of the oscillator, latch 180 itself is designed to limit the through current while also providing a weak latch. Transistors 172 and 174 are generally small transistors (i.e. small widths and lengths) to limit the current required from inverter 150 to switch inverter 170. However, because of their size, they generally cannot drive a large capacitive load at node N6. Too large a capacitance at node N6 is undesirable because this capacitance will cause the voltage at the node to switch slowly. Therefore, a weak latch is provided at node N6 by selecting transistors 184 and 186 to have smaller widths and lengths, preferably on the order of 1–2 $\mu$m, to limit the capacitance at node N6.

However, because transistors 184 and 186 of the latch have widths and lengths which are about equal, they also have a large width/length ratio and drive greater current. Therefore, current-limiting transistors 182 and 188 are included. These transistors have long channel lengths (and therefore small width/length ratios) to limit the current in the latch 180 and reduce power consumption in the circuit.

Figure 5:
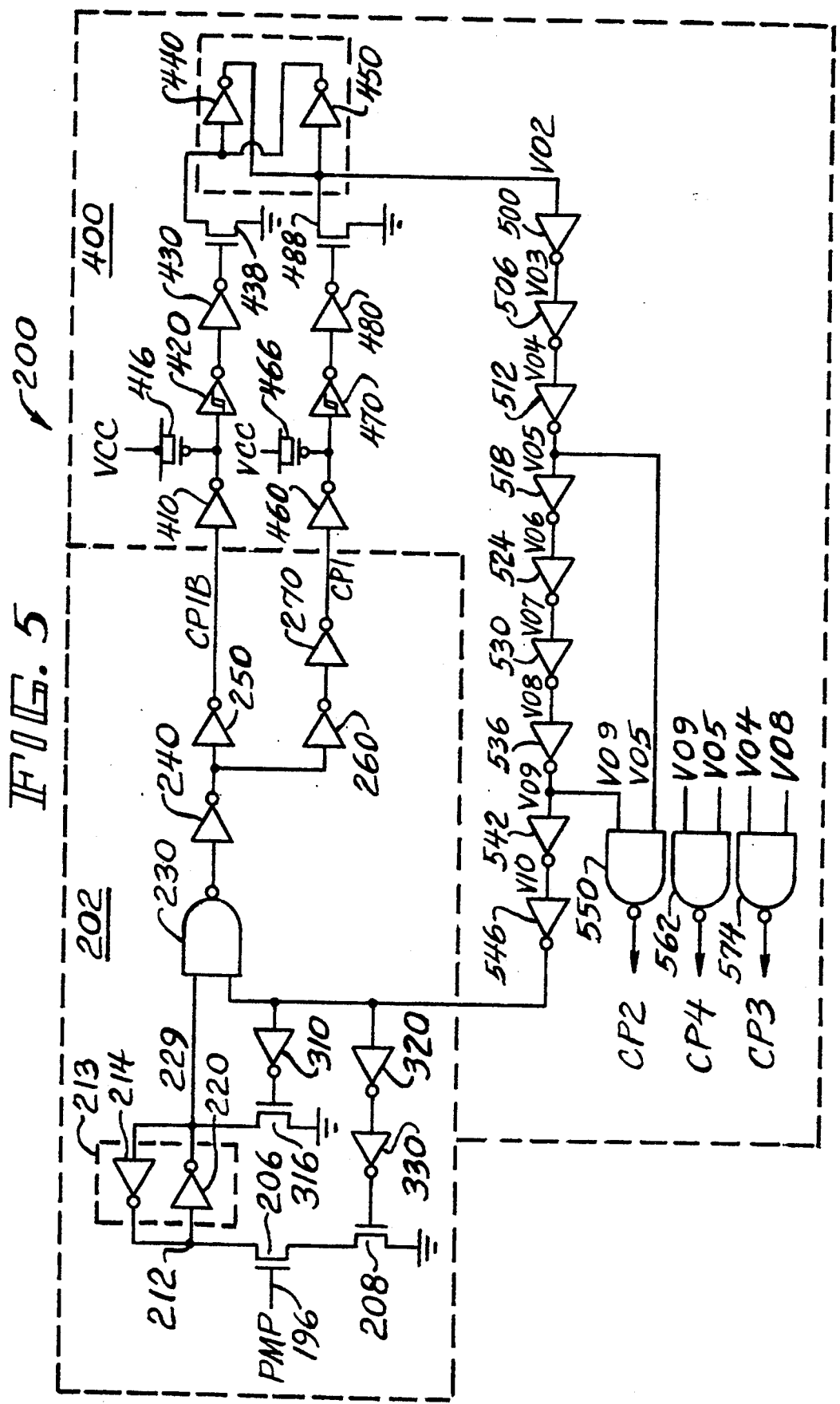
FIG. 5 is a block diagram of the clock circuit of FIG. 1.

Having generated a stable pump signal 196 in the voltage regulator circuit 100, a high pump signal 196 is used to activate self-timed clock circuit 200, shown in greater detail in FIG. 5. Generally, clock circuit 200 generates signals which control charge pump 600. A first stage 202 of circuit 200 generates clock signals CP1 and CP1B, while a second stage 400 of circuit 200 receives signals CP1 and CP1B to generate signals CP2, CP3 and CP4. (It will be recognized that "B" stands for "bar" and denotes a complementary signal.) The signals generated by stages 202 and 400 are used to drive the pump circuit 600. Preferably clock circuit 200 is a self-timed clock.

As will become apparent in reference to the pump circuit, the pump circuit operates on a two cycle principle: a pumping cycle and a precharge cycle. Therefore, the clock circuit must generate two sets of signals. While the clock circuit 200 generally operates in the same manner during both cycles, the circuit includes a feedback line to generate different signals during each cycle. The clock signals generated during the pump cycle will be described first, followed by the clock signals generated during the precharge cycle. Referring to FIG. 5, signal $V_{11}$, a feedback input to the first stage 202, generally determines the cycle of the pumping circuit. In the initial state, the outputs of the clock circuit will be those present after a precharge cycle and when the circuit is waiting to receive a pump signal. Therefore, signal $V_{11}$ is high and transistor 208 is on, allowing the clock circuit 200 to respond to the pump signal 196. When the pump signal 196 is low, the clock circuit and the current pump remain in the quiescent state until receiving a high pump signal.

THE SELF-TIMED CLOCK CIRCUIT

When pump signal 196 is high, transistor 206 is turned on to generate the clock signals during the pumping cycle. Node 212 at the input of latch 213 is pulled low and node 229 is pulled high when transistor 206 is turned on. Because both inputs to the NAND gate 230 are high, the output of the NAND gate is low. Therefore, in the pumping cycle, output signal CP1 is high (after the output of the NAND gate passes through inverters 240, 260 and 270), and output signal CP1B is low (after output of the NAND gate passes through inverters 240 and 250). The function of the signals will be understood in reference to the operation of the pump circuit shown in FIG. 8. These voltage signals generated by the first stage 202 of the clock circuit 200 are shown as a function of time in FIG. 9 and will be further discussed in reference to the pump circuit.

In addition to driving the pump circuit, CP1 and CP1B are used to drive the second stage 400 of the self-timed clock circuit and generate signals CP2, CP3 and CP4. CP1B and CP1 are input into inverters 410 and 460. These inverters along with associated capacitors 416 and 466 are a part of the self-timing circuitry of the clock circuit and are used as delay circuits. Inverters 410 and 460 include transistors having long channels which, along with capacitors 416 and 466, set the delay. The delay is necessary to set the time periods $T_{PUMP}$ and $T_{PRECHARGE}$, shown in the timing diagram of FIG. 9, to adequately pump all the charge during both cycles of the charge pump.

The signals charging capacitors 416 and 466 are input into the Schmitt triggered inverters 420 and 470 respectively. As is well known in the art, a Schmitt trigger can change a slow moving waveform (such as the signals used to charge capacitors 416 and 466) into a waveform having a sharp transition. A latch circuit including inverters 440 and 450 is used to prevent the output from floating and to generate a stable output $V_{02}$ when neither transistor 438 nor transistor 488 is driving the output $V_{02}$.

The output of the latch ($V_{02}$) is then transmitted through a series of inverters 500, 506, 512, 518, 524, 530, 536, 542, and 546, which produce a series of signals V03 to V11. These inverters generally provide delay and signal inversion for generating signals CP2, CP3 and CP4. Logic gates 550, 562 and 574 receive intermediate signals at various stages of the series of inverters to generate output signals CP2, CP4 and CP3, respectively. As is apparent from the circuit of FIG. 5, CP2 and CP4 are identical signals. The need for identical signals will become more clear in the description of the pumping cycles of the pump circuit of FIG. 8. Because NAND gate 574 is driven by signals which are separated by one additional inverter from the signals which drive NAND gates 550 and 562, CP2/4 and CP3 are non-overlapping active low signals which are 180° out of phase with each other. These non-overlapping signals are required (along with the CP1 and CP1B signals) to drive the pump circuit.

Because there is an odd number of inverters in the series of inverters 500–546, the feedback signal $V_{11}$ is the inverted signal of the input $V_{02}$ (and the initial signal $V_{11}$). This feedback configuration of signal $V_{11}$ is used in the self-timed feature of the present invention. Specifically, the inverted signal $V_{11}$, which is low after the pumping cycle, turns off transistor 208 to ignore the pump signal PMP (196) and to simultaneously begin the precharge cycle (i.e. generate clock signals CP1, CP1B, CP2, CP3 and CP4 used during the precharge). As a result, clock circuit 200 ignores the pump signal PMP and ensures that the pump 600 circuit remains in the precharge cycle for a required duration so that the charge pump 600 is able to transfer adequate charge to the substrate.

Signal $V_{11}$ is input into NAND gate 230 and inverter 310. At the end of the pumping cycle, V11 drops low (see FIG. 9). The output of inverter 310 goes high, therefore, and turns on transistor 316 to pull node 229 low thereby to reset the latch 213. As a result, both inputs to the NAND gate 230 are now low and the output of the NAND gate is high. The operation of the clock circuit during the precharge cycle is identical to the operation of the clock during the pumping cycle, except that the output signals from the respective gates are inverted. Therefore, the clock circuit generates signals for both the pumping cycle and the precharge cycle, and remains idle after a precharge cycle if the pump signal 196 is low.

The latch 213 plays a role in the self-timing of circuit 200. Once pump signal PMP goes high (assuming transistor 208 is on), node 212 is pulled to ground via the source-drain paths of series-connected transistors 206 and 208. This sets latch 213 in one state. Even if the PMP signal should now turn off (become inactive), latch 213 will remain in this one state, because the low voltage at node 212 causes inverter 220 to drive node 229 high, which in turn causes inverter 214 to drive node 212 low. Hence, the latch remains set until node 229 is eventually pulled low by transistor 316 turning on—which does not occur until V11 goes low after a timing interval. This is only one of two conditions required by circuit 200 to recognize a subsequent pump signal PMP. Even though V11 goes low at the end of the pump cycle (see time t4 in FIG. 9), that same low signal keeps transistor 208 off. Hence, new pump signals PMP from regulator circuit 100 will still not be effective to initiate new pumping. The self-timing feature as embodied in circuit 200 calls for a full precharge cycle to occur, after which V11 goes high. At that time, a new pump signal can be recognized.

Figure 6:
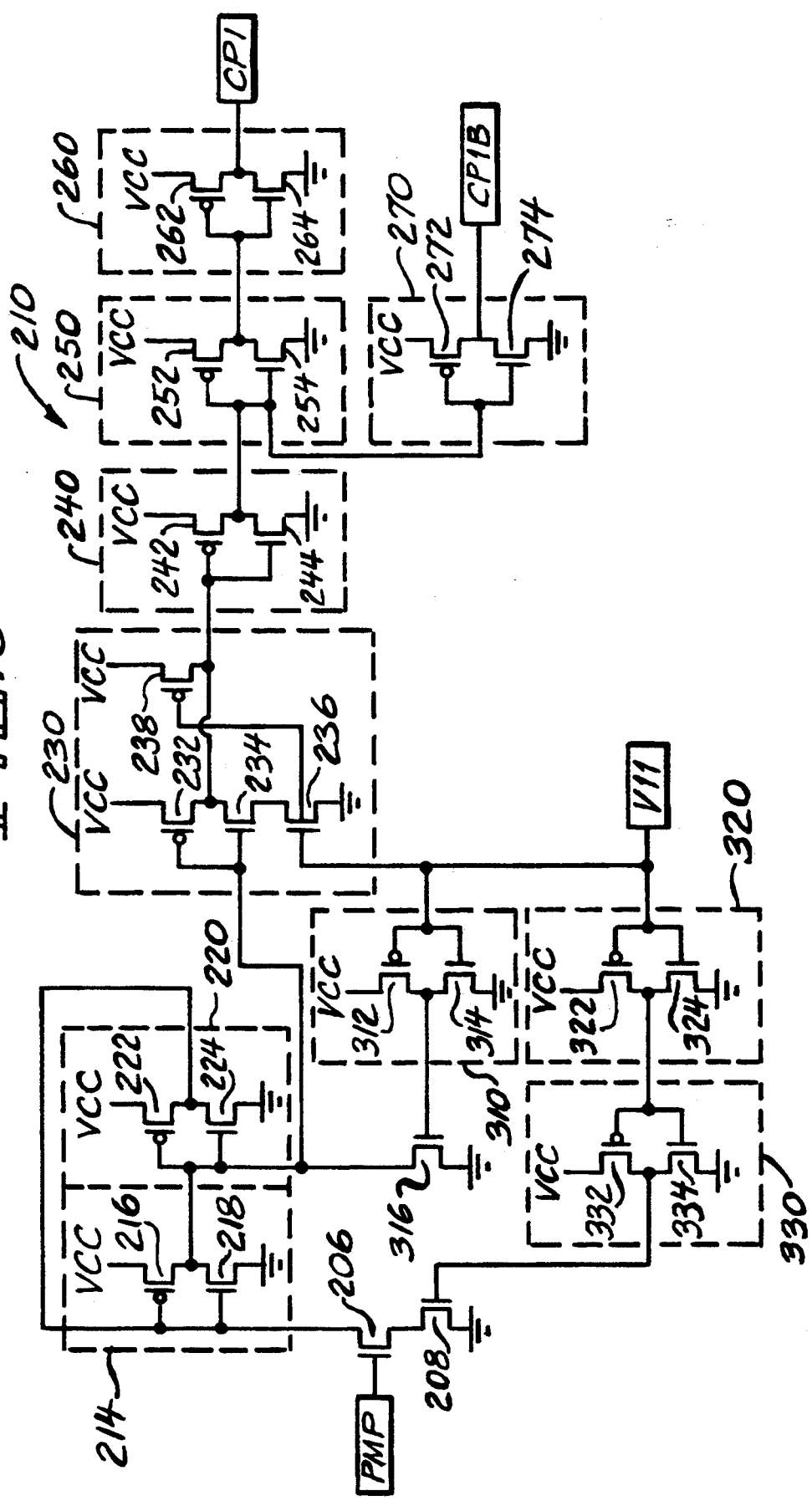
FIG. 6 is a detailed schematic of a first stage of the clock circuit of FIG. 5.
Figure 7:
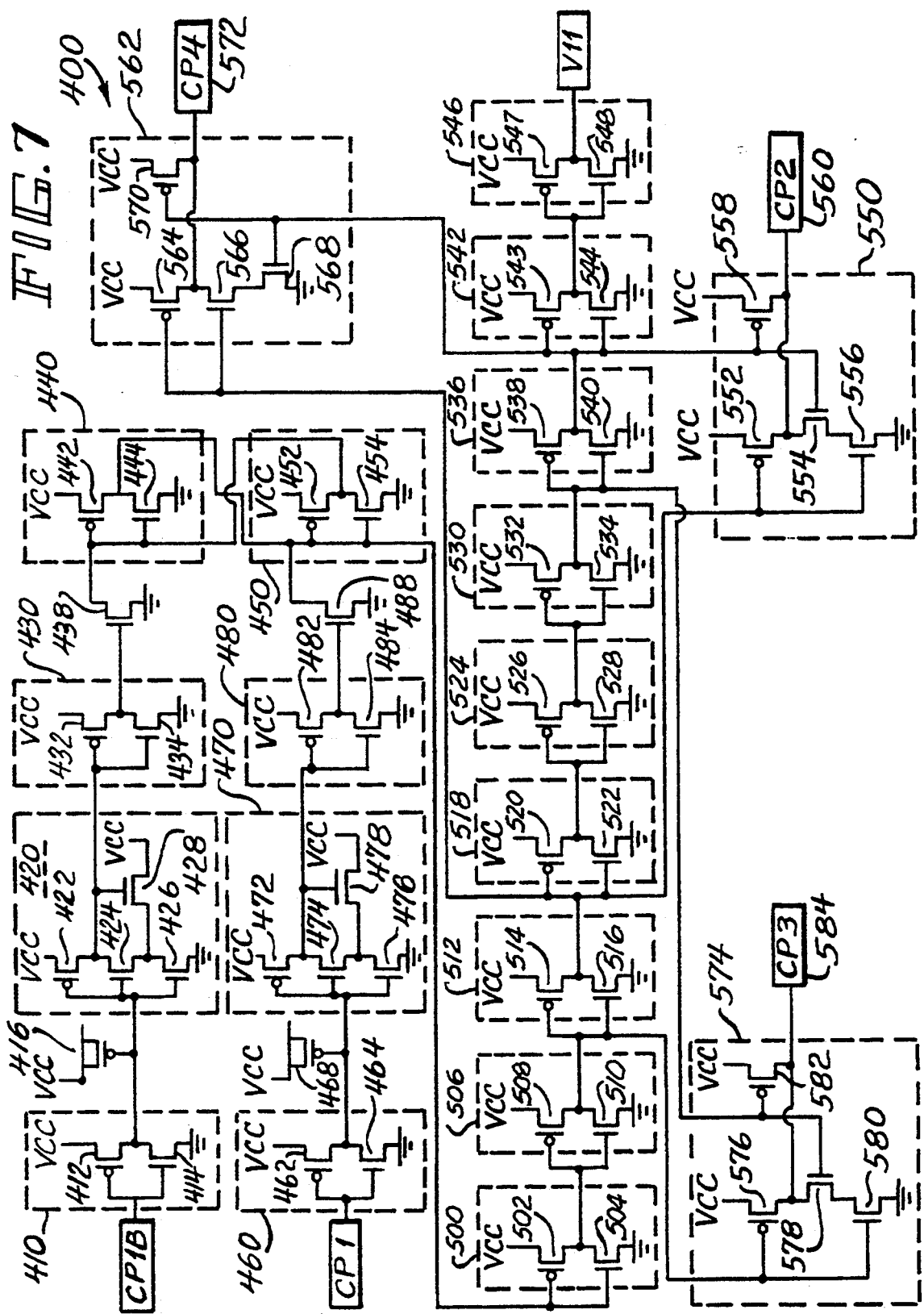
FIG. 7 is a detailed schematic of a second stage of the clock circuit of FIG. 5.

FIGS. 6 and 7 are detailed schematics of the first and second stages respectively of the self-timed clock circuit 200 of FIG. 5. These figures show the commonly known configuration of transistors used to form the various gates shown in block form in FIG. 5. For example, an inverter shown in block form is shown as a well known configuration of two transistors. While the operation of the clock circuit 200 is best described in reference to FIG. 5, these figures further are included to show the preferred schematic diagram of the clock circuit in detail, including the preferred dimensions of the transistors (set forth in Appendix A).

THE CHARGE PUMP

Figure 8:
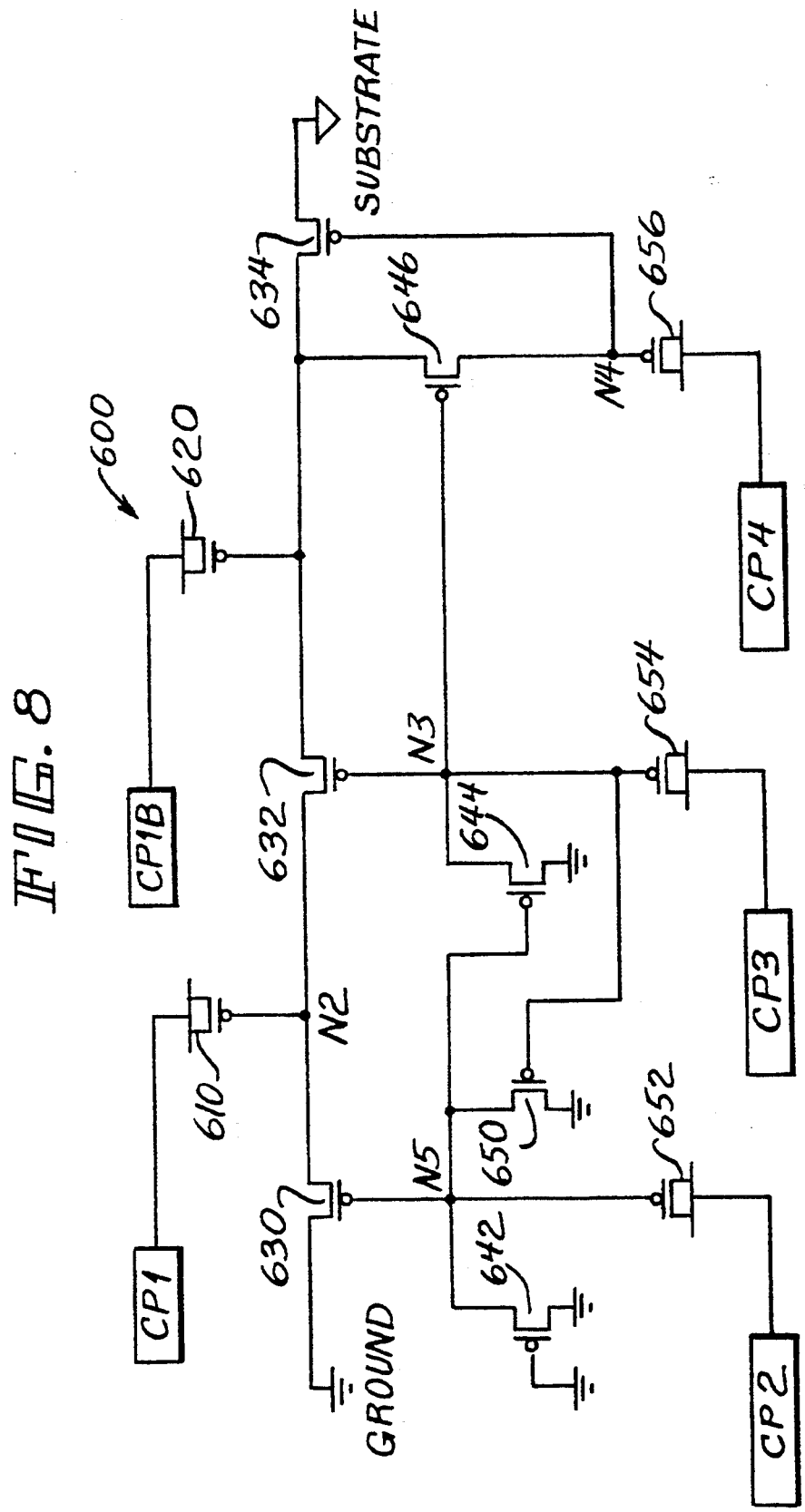
FIG. 8 is a schematic of a charge pump circuit for receiving the signals generated by the clock circuit to pump the voltage at the substrate to a desired value.

FIG. 8 shows the pump circuit 600, which is responsive to the clock signals generated by the clock circuit of 5. Pump circuit 600 as shown receives signals CP1, CP1B, CP2, CP3, and CP4. The general structure of the pump circuit will be described first, followed by a more detailed description of the operation of the pump circuit during the pumping cycle and the precharge cycle. The charge pump includes a number of nodes N1 to N5 and has an output to the substrate. Also, as shown, pump 600 has only P-channel transistors. The charge pump circuit is a two stage charge pump having capacitors 610 and 620 coupled to receive signals CP1 and CP1B. Signals CP1 and CP1B are used to change the voltages at nodes N2 and N1 when applied to capacitors 610 and 620. Capacitors 610 and 620 allow nodes N2 and N1 to be driven to a negative potential as is required to operate the charge pump. By changing the voltages at these nodes, charge (electrons) can be transferred along the path of transistors 630, 632 and 634 from ground to the substrate, ultimately to lower the voltage $V_{BB}$ at the substrate.

Because the charge pump used herein in the preferred embodiment is a two-stage charge pump, charge at node N2 (stored during a previous pumping cycle) will be pumped to node N1 during the precharge cycle, before being pumped to the substrate during the pumping cycle. Signals CP2, CP3 and CP4 are used to control transistors 630, 632 and 634 during the pumping cycle to advance charge from GND to N2 and from N1 to $V_{BB}$, and during the precharge cycle to advance charge from N2 to N1. Capacitors 652, 654 and 656 are also used to drive nodes N5, N3 and N4 to a negative potential to operate the charge pump. The operation of the pump circuit will be explained in more detail in reference to FIG. 9.

Figure 9:
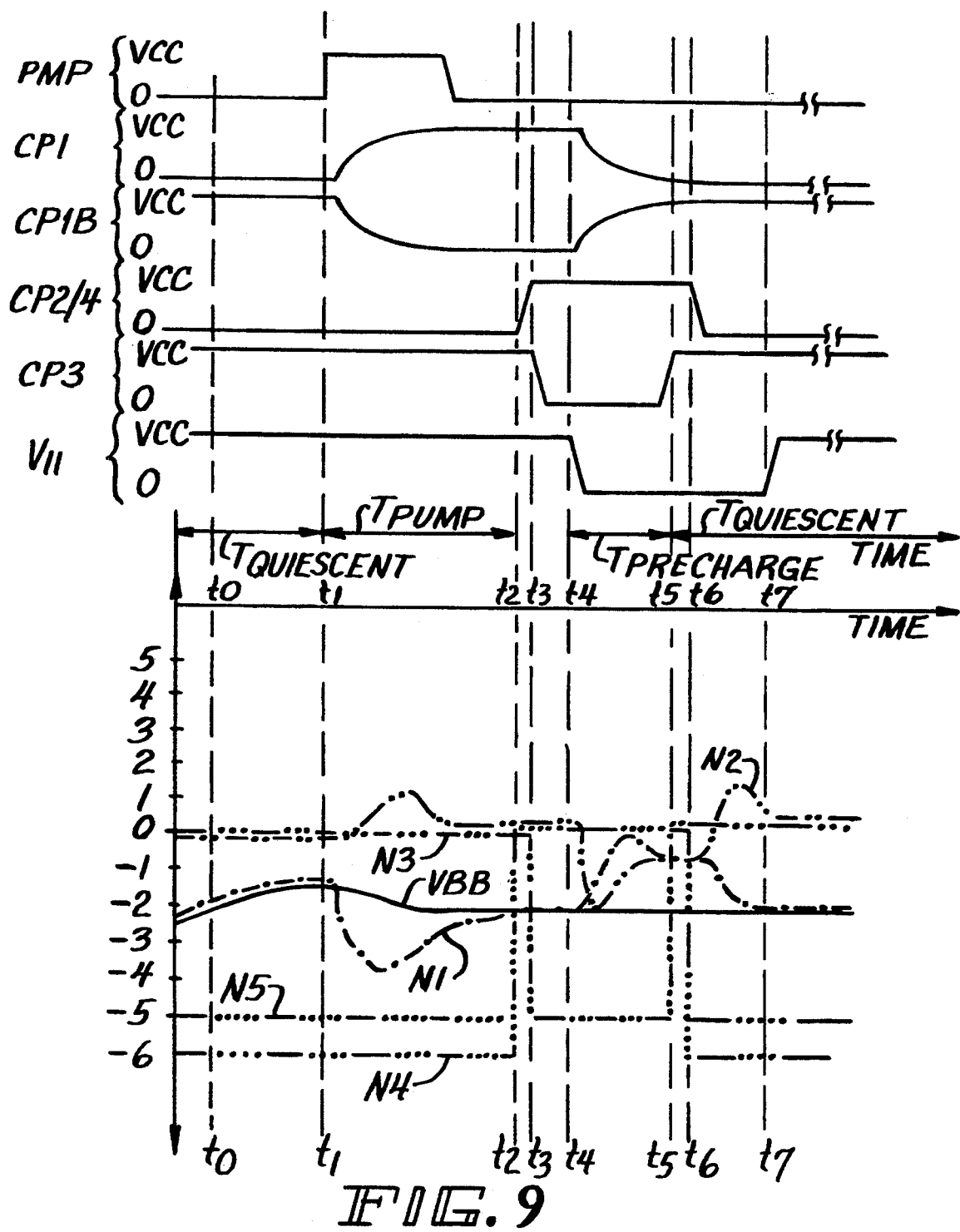
FIG. 9 is a timing diagram of (i) clock signals generated in the first and second stages of the clock circuit of FIG. 5 to drive the charge pump and (ii) voltages at nodes of the charge pump circuit of FIG. 8 during the pumping and precharge cycles.

FIG. 9 shows a timing diagram of the output signals of the clock circuit during a quiescent state (i.e. after a previous precharge cycle when the circuit is waiting for a pump signal), the pump cycle, the precharge cycle and a subsequent quiescent state. The reference to low or high clock signals is intended to mean ground potential or $V_{CC}$, respectively, where $V_{CC}$ is preferably 3 volts or 5 volts. Voltages present during the two cycles at various nodes of the pump circuit (designated as N1-N5 in FIG. 9) are also shown to provide a greater understanding of the operation of the two stage charge pump.

At a time t0 and during a quiescent period $T_{QUIESCENT}$, the clock signals and the voltages at the nodes are at the state after the precharge cycle is completed (which will be described later in reference to the $T_{PRECHARGE}$ period). These clock signals and voltages will remain in that state until the clock circuit receives a signal to pump.

At a time t1, the self-timed clock circuit 200 receives a high pump signal PMP to begin the pumping cycle. CP1 and CP1B gradually transition to high and low voltages respectively. CP2 and CP4 are low after the previous precharge cycle, turning on transistors 630 and 634. Because CP3 is high and transistor 632 is off, there is no direct path from ground to the substrate and there can be no undesired flow of charge. As CP1 rises, the voltage at node N2 increases and draws negative charge from ground to node $N_2$ via the source-drain path of transistor 630 (which is turned on with a low CP2 signal). Therefore, node N2 gradually equalizes to ground potential. Also, as CP1B transitions to a low level, charge (transferred from node N2 to node N1 during the previous precharge cycle) is transferred from node N1 to the substrate, lowering $V_{BB}$ as shown during period $T_{PUMP}$. As is apparent, the voltage at node N1 initially decreases, and equalizes with $V_{BB}$ as the voltage at $V_{BB}$ is gradually lowered to desired voltage, preferably minus two (−2) volts.

During a previous precharge cycle, node N4 is coupled to node N1 by turning on transistor 646. When transistor 646 is on, the voltage at the gate of transistor 634 is clamped to its source, ensuring that transistor 634 remains off during the precharge. Node N4 is also coupled to node N1 during the precharge cycle by turning on transistor 646 in order to maintain node N4 at a voltage below ground potential. Node N4 is maintained below ground potential at approximately minus one (−1) volt to ensure that transistor 634 will turn on as CP4 transitions to a low level and all the charge is transferred to the substrate during the pumping cycle. Finally, transistor 644 is coupled to node N3, clamping N3 to ground potential during the pumping cycle to ensure that transistor 632 remains off. (It will be recalled that node N2 is negative, so if the gate electrode of transistor 632 is at ground, the transistor is off.) Thus, no charge is transferred from node N2 (or ground) to node N1 at this time. Therefore, during the pumping cycle, charge is pumped from ground to node N2 and from N1 to the substrate.

At a later time t2, the signals CP2 and CP4 transition from low to high as signals CP1 and CP1B are passed through the second stage 400 of the clock circuit. Therefore, time t2 marks the end of the pumping stage.

At a time t3, signal CP3 transitions from high to low, preparing the circuit for the precharge cycle. Signal CP3 transitions after CP2 and CP4 transitions to provide a non-overlapping active low signal. Therefore, transistor 632 is not turned on by a low CP3 signal driving node N3 low until after transistors 630 and 634 are already turned off (i.e. when signals CP2 and CP4 previously transitioned from low to high at time t2). This timing prevents any undesirable current flow between ground and node N2 and node N1 and the output to the substrate.

At a time t4, signal V11 goes low, marking the beginning of the precharge cycle. As discussed earlier in reference to the clock circuit, the clock circuit shown in FIG. 5 ignores any pump signal PMP during the precharge cycle as the pump circuit is preparing for a subsequent pump cycle (i.e. if the clock circuit should receive a pump signal after the precharge cycle is completed). This provides the self-timed feature by ensuring that pumping circuit 600 is fully ready to pump when it receives the clock signals used for pumping.

During the pre-charge cycle $T_{PRECHARGE}$, CP1 transitions to a low level and CP1B transitions to a high level. As these signals change, node N2 becomes more negative, while node N1 becomes more positive. Because CP3 is low, transistor 632 is on, allowing charge to be transferred from node N2 to node N1. However, transistors 630 and 634 are turned off with high CP2 and CP4 signals to prevent any undesired transfer of charge from ground to node N2 or from node N1 to the substrate.

The pump circuit further includes transistors 646 and 650 to ensure that transistors 630 and 634 remain off during the precharge cycle. Specifically, transistors 646 and 650 clamp the gate voltages of transistors 630 and 634 at nodes N4 and N5 to their respective source voltages to prevent any undesired transfer of charge. When CP3 is low, transistor 650 is on and clamps node N5 to ground, ensuring that transistor 630 is off during the precharge. (It will be recalled that the source of transistor 630 is ground, so it is off.). Also, transistor 646 is on during the pre-charge cycle to ensure that transistor 634 remains off. Transistor 646 also serves another function, previously discussed in regard to the pumping cycle. Transistor 646 clamps the voltage at node N4 to node N1 (at approximately minus one (−1) volt) to ensure that the voltage at node N4 is low enough so that transistor 634 will be turned on during a subsequent pumping cycle. Therefore, no charge is transferred between ground and node N2 or node N1 and the substrate. As is apparent near the end of the $T_{PRECHARGE}$, the voltage at nodes N1 and N2 equalize at a resulting voltage of approximately minus one (−1) volt. As nodes N2 and N1 equalize, the charge pump is in a stable state for a subsequent pumping cycle, should the charge pump receive a pumping signal.

As signals CP1 and CP1B are transmitted through the second stage 400 of the clock circuit, CP3 transitions to a high level at a time t5, turning off transistor 632 and ending the precharge cycle. At a time t6, CP2 and CP4 transition low, turning on 630 and 634 to prepare for the next pumping cycle. The transition of the signals CP2, CP3 and CP4 is again chosen to prevent any undesired flow of current between ground and the substrate.

Finally, at time t7, signal V11 transitions to a high level, allowing the clock circuit to read the pump signal 196. If the pump signal PMP is high, the clock circuit will generate the signals in the $T_{PUMP}$ cycle followed by the $T_{PRECHARGE}$ cycle. If the pump signal is low, the clock circuit remains in the quiescent state shown in $T_{QUIESCENT}$ until receiving a high pump signal.

To recapitulate, the circuit of the present invention provides a low current and low power dissipation substrate bias generator. The circuit also draws low current because no continuously running oscillator is selectively connected to a pump. Instead, a clock circuit 200 is selectively operated for a pumping cycle followed by a full precharge cycle, and then enters a quiescent state until a new pump signal is subsequently generated. The self-timed feature of the clock allows the clock to ignore the pumping signal until the precharge cycle is complete.

While this invention has been described with reference to an illustrative embodiment, it will be understood that this description is not intended to be construed in a limiting sense, but is intended to include any substitutes within the spirit and scope of the invention. Various modifications of the illustrative embodiment, as well as other embodiments, will become apparent to those skilled in the art upon reference to this description. For example, any type of charge pump could be used within the scope of the present invention. Specifically, a single stage charge pump or a pump employing n-channel transistors could be used. Also, the voltage bias generator of the present invention could provide an oscillatorless pump drawing low current to pump charge to a node of an integrated circuit other than the substrate to maintain that node at a desired potential. The invention is intended to be set forth in the appended claims.

APPENDIX A

| TRANSISTOR NUMBER | Width (Micrometers) for 3V Vcc | Length (Micrometers) for 3V Vcc |
|---|---|---|
| 112–114 | 2 | 240 |
| 122–126 | 2 | 270 (180) |
| 132 | 2 | 10 (40) |
| 134–136 | 2 | 20 |
| 138–140 | 2 | 60 |
| 154 | 1 | 4 |
| 156 | 1 | 12 |
| 158 | 1 | 80 |
| 164 | 1 | 40 |
| 166 | 1 | 8 |
| 168 | 1 | 8 |
| 172 | 2 | 1.2 |
| 174 | 1 | 1 |
| 182 | 1 | 100 |
| 184 | 1 | 1.1 |
| 186 | 2 | 1 |
| 188 | 1 | 200 |
| 192 | 4 | 1.2 |
| 194 | 2 | 1 |
| 206 | 16 | 1 |
| 208 | 16 | 1 |
| 216 | 4 | 1.2 |
| 218 | 2 | 1 |
| 222 | 2 | 1.2 |
| 224 | 2 | 1 |
| 232 | 8 | 2 |
| 234 | 8 | 1 |
| 236 | 8 | 1 |
| 238 | 8 | 2 |
| 242 | 12 | 2 |
| 244 | 6 | 2 |
| 252 | 12 | 2 |
| 254 | 6 | 2 |
| 262 | 60 | 1.2 |
| 264 | 30 | 1.2 |
| 272 | 60 | 1.2 |
| 274 | 30 | 1.2 |
| 312 | 2 | 1.2 |
| 314 | 1 | 1 |
| 316 | 8 | 1 |
| 322 | 2 | 1.2 |
| 324 | 1 | 1 |
| 332 | 8 | 1.2 |
| 334 | 4 | 1 |
| 412 | 2 | 10 |
| 414 | 2 | 1 |
| 416 | 80 | 3.5 |
| 422 | 2 | 1.2 |
| 424–428 | 2 | 1 |
| 432 | 4 | 1.2 |
| 434 | 2 | 1 |
| 438 | 4 | 2 |
| 442–454 | 4 | 8 |
| 462 | 20 | 10 |
| 464 | 2 | 1 |
| 466 | 80 | 3.5 |
| 472 | 2 | 1.2 |
| 474-8 | 2 | 1 |
| 482 | 4 | 1.2 |
| 484 | 2 | 1 |
| 488 | 4 | 2 |
| 502 | 4 | 4 |
| 504 | 4 | 8 |
| 508 | 2 | 5 |
| 510 | 5 | 4 |
| 514 | 2 | 5 |
| 516 | 5 | 4 |
| 520 | 2 | 6 |
| 522 | 6 | 4 |
| 526 | 8 | 8 |

| TRANSISTOR NUMBER | WIDTH IN MICROMETERS (Width for 3V Vcc) | LENGTH IN MICROMETERS (Length for 3V Vcc) |
|---|---|---|
| 528 | 4 | 8 |
| 532 | 2 | 5 |
| 534 | 5 | 4 |
| 538 | 2 | 5 |
| 540 | 5 | 4 |
| 543 | 2 | 6 |
| 544 | 6 | 4 |
| 547 | 2 | 8 |
| 548 | 4 | 2 |
| 552–582 | 15 | 1.2 |
| 610 | 1260 | 25 |
| 620 | 1260 | 25 |
| 630–634 | 630 | 1.7 |
| 642 | 4 | 1.7 |
| 644–650 | 15 | 1.7 |
| 652–656 | 315 | 25 |

We claim:

1. A substrate bias generator for an integrated circuit comprising:
   a voltage regulator circuit coupled to the substrate of said integrated circuit for outputting a clock enabling signal when the substrate voltage varies from a predetermined level;
   a self-timed clock circuit coupled to receive the clock enabling signal from the voltage regulator circuit and configured to generate a full cycle of clock signals in response thereto, the clock circuit including means for maintaining a full self-timed cycle even when the clock enabling signal terminates during the self-timed cycle; and
   a pump circuit responsive to the clock signals for pumping charge to the substrate to alter the voltage at the substrate and preparing for subsequent pumping.

2. The substrate bias generator for an integrated circuit of claim 1 wherein the voltage regulator circuit comprises:
   a first resistor network for generating a $V_{CCREF}$ signal proportional to a $V_{CC}$ signal;
   a second resistor network for generating a $V_{BBREF}$ signal proportional to the voltage $V_{BB}$ at the substrate;
   a differential amplifier circuit for comparing $V_{CCREF}$ and $V_{BBREF}$;
   a series of inverters coupled to said differential amplifier to output a clock enabling signal when $V_{BBREF}$ exceeds $V_{CCREF}$.

3. The substrate bias generator for an integrated circuit of claim 2 wherein the differential amplifier circuit includes transistors having long channels to limit the current in the circuit.

4. The substrate bias generator for an integrated circuit of claim 2 wherein the series of inverters in the voltage regulator circuit includes transistors having channel lengths selected to limit the current loss from $V_{CC}$ to ground in the circuit.

5. The substrate bias generator for an integrated circuit of claim 2 further including a latch circuit to output a stable clock enabling signal.

6. The substrate bias generator for an integrated circuit of claim 1 wherein the clock circuit includes:
   a first stage for receiving the clock enabling signal and outputting first and second signals; and
   a second stage for receiving the first and second signals and further outputting third, fourth and fifth signals; and
   wherein the pump circuit is responsive to the first through fifth signals to lower the voltage of said integrated circuit substrate.

7. The substrate bias generator for an for an integrated circuit of claim 6 wherein the pump circuit is a two stage pump including p-channel transistors.

8. The substrate bias generator for an integrated circuit of claim 1 wherein the self-timed clock circuit is not free running.

9. The substrate bias generator for an integrated circuit of claim 1 wherein after the self-timed clock circuit receives one clock enabling signal, it ignores a subsequent clock enabling signal until after the completion of the full cycle of clock signals.

10. A substrate bias generator for an integrated circuit comprising:
- a low current voltage regulator coupled to the substrate of said integrated circuit for monitoring the voltage at the substrate and outputting an active clock enabling signal when the voltage varies from a predetermined level;
- a low current, self-timed clock circuit which is not free running and is responsive to the active clock enabling for generating clock signals, said clock circuit including a first stage for receiving the clock enabling signal and a second coupled to the first stage, the first and second stages outputting a plurality of clock signals;
- a pump circuit responsive to the plurality of signals to pump charge and to lower the voltage of the substrate of said integrated circuit; and
- wherein the self-timed clock circuit ignores any changes in the clock enabling signal until after the completion of the pumping.

11. A method of regulating the voltage of the substrate of an integrated circuit device including the steps of:
- monitoring the voltage at said substrate including generating a $V_{CCREF}$ signal proportional to a $V_{CC}$ signal, generating a $V_{BBREF}$ signal proportional to the voltage $V_{BB}$ at the substrate, comparing $V_{CCREF}$ and $V_{BBREF}$, and outputting a clock enabling signal when $V_{BBREF}$ exceeds $V_{CCREF}$;
- operating a self-timed clock circuit in response to a first clock enabling signal to provide a full cycle of clock signals for causing a charge pump to pump charge to the substrate and to precharge for subsequent pumping despite any termination of the first clock enabling signal or receipt of a second clock enabling signal during said full cycle of clock signals.

12. The generator of claim 1 wherein the self-timed clock circuit includes first and second stages, the first stage comprising said means for maintaining:
- the first stage receiving the clock enabling signal and a timing signal from the second stage,
- the first stage being configured so that once the clock enabling signal is received, the self-timed clock circuit becomes enabled and executes a self-timed cycle even when the clock enabling signal terminates during the self-timed cycle.

13. The generator of claim 12 wherein the first stage of the self-timed clock circuit includes an input latch circuit;
- wherein the first stage is configured to set the input latch into a first stage in response to the first stage first receiving the clock enabling signal;
- wherein the first stage is configured so that the input latch circuit cannot be set into a second state opposite to the first state until after receiving said timing signal from the second stage.

14. The generator of claim 13 wherein the first stage of the self-timed clock circuit is configured to prevent a clock enabling signal received subsequent to the first-received clock enabling signal from causing the input latch circuit to enter the first state until after the self-timed cycle of the clock circuit has substantially transpired.

15. The generator of claim 1 wherein the self-timed clock circuit includes first and second stages, the first stage including:
- a latch having first and second nodes;
- a first transistor having a first terminal coupled to said first node, a second terminal, and a control electrode coupled to receive the clock enabling signal;
- a second transistor having a first terminal connected to the second terminal of the first transistor, a second terminal coupled to a voltage source, and a control electrode responsively coupled to the second stage;
- a third transistor having a first terminal coupled to the second node of the latch, a second terminal coupled to said voltage source, and a control electrode responsively coupled to the second stage to change the state of the latch.

16. The generator of claim 15 wherein receipt of the clock enabling signal at the first transistor (206) causes the latch (213) to enter a first state and allows the second stage to produce first ones of said clock signals for the pump circuit during a first time within said self-timed cycle;
- wherein after the first time, a timing signal from the second stage causes said third transistor (316) to change the state of the latch from the first stage to the second state and causes transistor (208) to prevent the latch from reentering the first state despite receipt of another clock enabling signal at said first transistor (206);
- wherein setting the latch from the first state to the second state allows the second stage to produce second ones of said clock signals during a second time after the first time;
- wherein a change in state of said timing signal from the second stage causes said second transistor (208) to change state at substantially the end of the second time, thereby to allow a further clock enabling signal received thereafter by said first transistor to set the latch in the first state;
- whereby a self-timed cycle is fully executed in response to receipt of an enabling signal regardless of any change in the clock enabling signal during the self-timed cycle, following which a subsequent clock enabling cycle will set the latch to initiate another full self-timed cycle.

17. A method of operating a charge pump for biasing the voltage of a substrate of an integrated circuit comprising the steps of:
- producing a clock enabling signal if the substrate voltage should be pumped;
- applying the clock enabling signal to a self-timed clock circuit;
- operating the self-timed clock circuit to generate a full cycle of clock signals in response to receiving the clock enabling signal regardless of the state of clock enabling signal during the full cycle;
- using the clock signals to cause a charge pump to pump charge to the substrate and precharging the charge pump; and
- then preparing to respond to a subsequent clock enabling signal.

18. The method of claim 17 including operating a circuit element so that after receipt of a first clock enabling signal, subsequent enabling or disabling signals will be disregarded until the full cycle of clock signals have been generated by the self-timed clock circuit.

19. The method of claim 17 including setting a latch in response to receiving a clock enabling signal and initiating the generating of the full cycle of clock signals in response to setting said latch.

20. The method of claim 19 wherein said operating step includes resetting said latch prior to completing said full cycle of clock signals.

21. The method of claim 20 wherein said operating step also includes generating first and second groups of said clock signals, said first group being used for causing the charge pump to pump charge to the substrate.

22. The method of claim 21 wherein said second group of clock signals corresponds to precharging the charge pump, and wherein the operating step also includes preventing the clock enabling signal from setting the latch again until after the second group of clock signals has been generated.

23. The method of claim 17 wherein receipt of the clock enabling signal causes a latch (213) in the self-timed clock circuit to enter a first state and allows the clock circuit to produce the clock signals for the charge pump during a first self-timed subcycle;
wherein the first self-timed subcycle causes a change in the state of the latch from the first state to a second state and prevents the latch into from reentering the first state despite receipt of another clock enabling signal;
wherein setting the latch from the first state to the second state allows the clock circuit to execute a second self-timed subcycle;
wherein the second self-timed subcycle enables the self-timed clock circuit to respond to a subsequent clock enabling signal to set the latch in the first state;
whereby a first self-timed subcycle of pumping is fully executed in response to receipt of a first clock enabling signal and then a second self-timed subcycle is fully executed despite receipt of any clock enabling signals during the second self-timed subcycle, following which a subsequent clock enabling signal will set the latch to initiate another pair of first and second self-timed subcycles.

24. The method of claim 17 wherein said operating step includes setting a latch if a clock enabling signal is received indicative that the substrate voltage is to be pumped and if the self-timed clock circuit is not already generating the full cycle of clock signals,
but if the self-timed clock circuit is already generating clock signals, then allowing the full cycle of clock signals to be generated by the clock circuit despite the condition of the clock enabling signal.

25. A method of operating a charge pump for biasing the voltage of a substrate of an integrated circuit comprising the steps of:
producing a first clock enabling signal and applying it to a self-timed clock circuit;
in response to said first clock enabling signal, operating the self-timed clock circuit and a charge pump connected thereto in a pump mode and then a precharge mode, and only thereafter entering a quiescent state wherein the self-timed clock circuit is ready to respond to a subsequent clock enabling signal,
including continuing said operating step to completion even if the first clock enabling signal terminals before said completion; and
disregarding any clock enabling signals occurring subsequent to said first clock enabling signal but before said completion.

26. A method of operating a charge pump for biasing the voltage of a substrate of an integrated circuit comprising the steps of:
in response to a demand signal, initiating the generation of a full cycle of clock signals over a predetermined intervals, said full cycle including a plurality of first clock signals followed by a plurality of second clock signals, said full cycle being generated despite any termination in the demand signal;
using said first clock signals to cause a charge pump to pump charge to the substrate; and
using said second clock signals to precharge the charge pump.

27. The method of claim 26 wherein said initiating step includes receiving the demand signal at an input of a self-timed clock circuit, the self-timed circuit generating the first and second clock signals over a self-timed interval;
the method further including preventing the self-timed clock circuit, until substantially the end of the self-timed interval, from subsequently initiating the generation of clock signals so that after receipt of a first demand signal, any termination of the first demand signal or initiation of a subsequent demand signal will be disregarded until the full cycle of first clock signals and second clock signals has been generated by the self-timed clock circuit.

28. The method of claim 27 including storing a first state in response to receiving a demand signal and initiating the generation of said first clock signals in conjunction with said storing step.

29. The method of claim 28 further storing a second state and initiating the generating of the second clock signals in conjunction therewith.

30. The method of claim 29 wherein said step of storing a second state occurs substantially at the end of generating the first clock signals.

31. The method of claim 30 wherein the method also includes preventing any re-storing of the first state until substantially all of the second clock signals have been generated.

32. The method of claim 26 wherein the initiating step includes, in response to receiving the demand signal, causing a latch in a self-timed clock circuit to enter a first state and producing the first clock signals during a first self-timed integral;
at substantially the end of the first self-timed interval, changing the state of the latch from the first state to a second state and preventing the latch into from reentering the first state despite receipt of another demand signal;
executing a second self-timed interval in the self-timed clock circuit in connection with setting the latch from the first state to the second state;
using a signal generated in the second self-timed interval to enable the self-timed clock circuit to respond to a subsequent demand signal to set the latch in the first state;
whereby a first self-timed interval of pumping charge occurs fully in response to receipt of a first demand signal and then a second self-timed interval of precharging the charge pump occurs fully, despite receipt of any demand signals during the second self-timed interval, following which a subsequent demand signal may set the latch to initiate another pair of first and second self-timed intervals.

33. The method of claim 26 wherein said initiating step includes setting a latch if a demand signal is received indicative that the substrate is to be pumped and if the full cycle of clock signals is not already being generated;

but if the full cycle of clock signals is already being generated, then allowing the full cycle of clock signals to be generated despite the conditions of the demand signal.

34. A method of operating a charge pump for biasing the voltage of a substrate of an integrated circuit comprising the steps of:

obtaining a demand signal indicative of a demand for voltage and applying the demand signal to an input of a self-timed clock circuit;

operating the self-timed clock circuit in response to said demand signal to generate clock signals;

operating a charge pump connected to the self-timed clock circuit in a pump mode and then a precharge mode, the pump mode pumping charge to the substrate; and thereafter entering a quiescent state wherein the self-timed clock circuit is ready to respond to a subsequent demand signal, including continuing said operating steps to completion even if the demand signal terminates before said completion; and disregarding any demand signals subsequent to the first-received demand signal but before said completion.

35. A method of operating a charge pump for biasing the voltage of a substrate of an integrated circuit comprising the steps of:

a monitor circuit for providing a demand signal indicative that adjustment of the substrate voltage is in demand;

a clock circuit coupled to receive the demand signal for generating a full set of clock signals including first clock signals for use by a charge pump to pump charge and second clock signals for precharging the charge pump;

the clock circuit being configured to complete said generating of a full set of clock signals despite any termination of the demand signal;

a charge pump responsively coupled to the clock circuit; and the charge pump being effective to pump charge to the substrate;

the charge pump being precharge by the second clock signals;

whereby the generation of a full set of clock signals permits the charge pump to pump and precharge fully in response to receipt of a demand signal despite any change in the demand signal during said full cycle of clock signals.

* * * * *